(12) United States Patent
Nakao et al.

(10) Patent No.: US 11,867,918 B2
(45) Date of Patent: Jan. 9, 2024

(54) LIGHT SOURCE APPARATUS AND LASER LIGHT SOURCE APPARATUS FOR FLOW CYTOMETER

(71) Applicant: KYOCERA SOC Corporation, Yokohama (JP)

(72) Inventors: Satoshi Nakao, Yokohama (JP); Masami Hatori, Yokohama (JP); Kenji Ohara, Yokohama (JP); Isao Masukawa, Yokohama (JP)

(73) Assignee: KYOCERA SOC Corporation, Yokohama (JP)

( * ) Notice: Subject to any disclaimer, the term of this patent is extended or adjusted under 35 U.S.C. 154(b) by 183 days.

(21) Appl. No.: 17/690,716

(22) Filed: Mar. 9, 2022

(65) Prior Publication Data
US 2023/0059268 A1   Feb. 23, 2023

(30) Foreign Application Priority Data

Aug. 18, 2021   (JP) ................. 2021-133191

(51) Int. Cl.
| | |
|---|---|
| *G02B 27/00* | (2006.01) |
| *G02B 27/09* | (2006.01) |
| *G02B 27/30* | (2006.01) |
| *G02B 19/00* | (2006.01) |
| *H01S 5/40* | (2006.01) |
| *G01N 15/14* | (2006.01) |

(52) U.S. Cl.
CPC ..... *G02B 27/0922* (2013.01); *G02B 19/0009* (2013.01); *G02B 19/0057* (2013.01); *G02B 27/0025* (2013.01); *G02B 27/0972* (2013.01); *G02B 27/30* (2013.01); *H01S 5/4012* (2013.01); *H01S 5/4087* (2013.01); *G01N 15/1434* (2013.01)

(58) Field of Classification Search
CPC ............ G02B 27/0922; G02B 27/0025; G02B 27/0972; G02B 27/30; G02B 26/0883; G02B 27/141
See application file for complete search history.

(56) References Cited

U.S. PATENT DOCUMENTS 8,619,370 B2 * 12/2013 Hunter ............... G01N 15/1459
359/629

FOREIGN PATENT DOCUMENTS

| JP | 2013527929 A | 7/2013 |
|---|---|---|
| JP | 201762247 A | 3/2017 |
| JP | 202073873 A | 5/2020 |

* cited by examiner

*Primary Examiner* — Joseph P Martinez
(74) *Attorney, Agent, or Firm* — Timothy W. Menasco, Esq.; Harter Secrest & Emery LLP

(57) ABSTRACT

A light source apparatus can avoid double-counting of particles in a flow cytometer for measuring and analyzing a plurality of particles flowing in a flow cell. A light source apparatus for a flow cytometer includes a semiconductor laser for emitting a laser beam, a collimating lens for collimating the laser beam emitted from the semiconductor laser in a spread light state, a first beam conversion unit composed of prisms and a second beam conversion unit composed of prisms for matching a flow cell length direction with a slow axis direction of the collimated laser beam in a flow cell after reducing the beam diameter in a fast axis direction and increasing the beam diameter in the slow axis direction, and a focusing lens for focusing the laser beam passed through these beam conversion units in the flow cell.

13 Claims, 12 Drawing Sheets

IDEAL GAUSSIAN BEAM   TWO PROTRUSIONS   SHOULDER   PROTRUSION

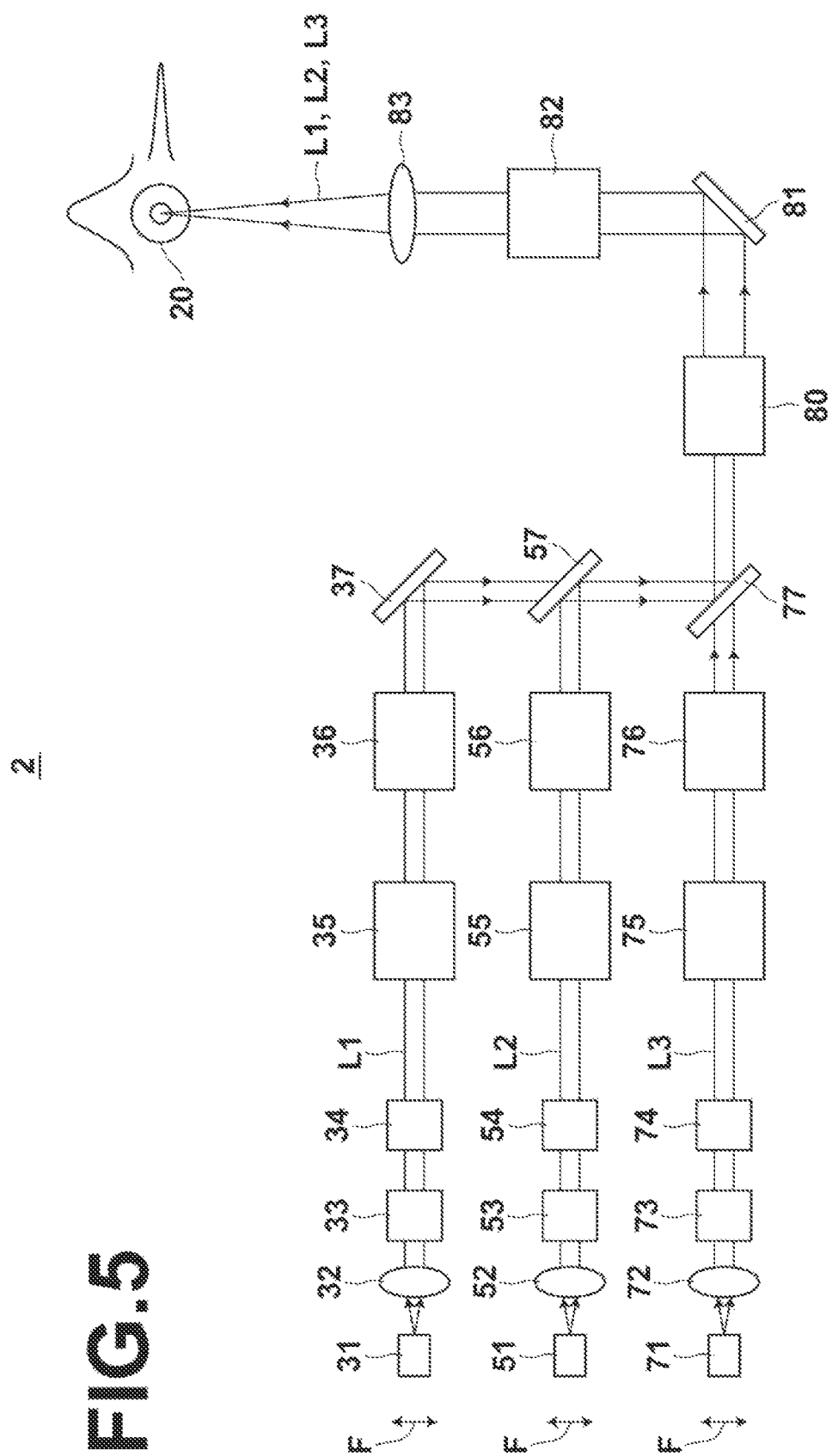

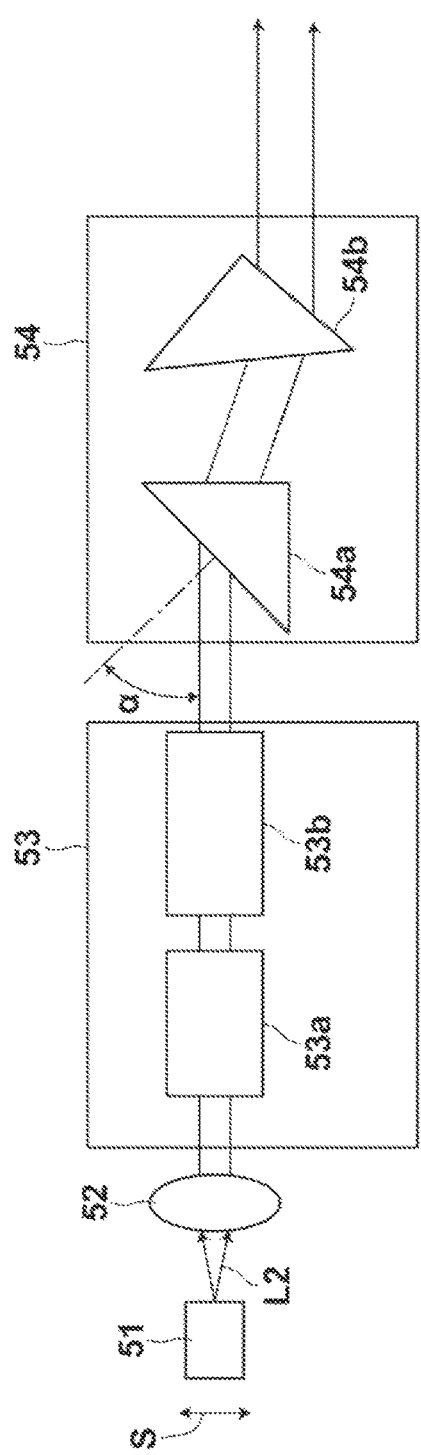
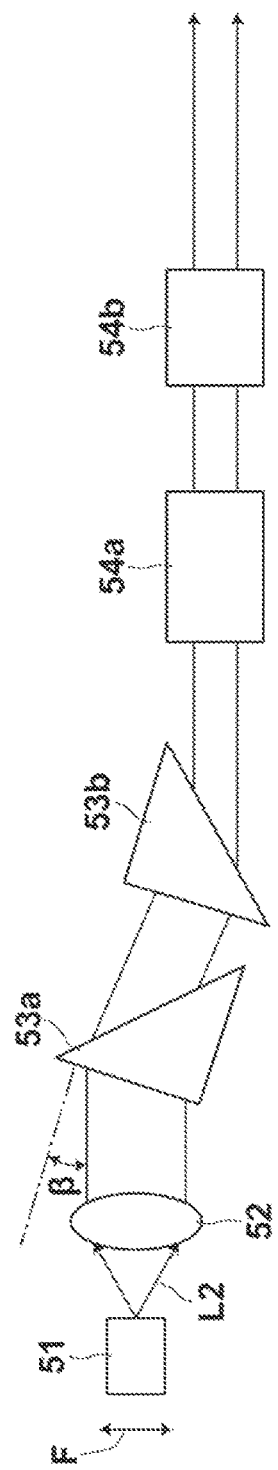

FIG. 7

| WAVELENGTH | BEAM | COLLIMATED BEAM DIAMETER | INCIDENT ANGLE TO FIRST BEAM CONVERSION UNIT | INCIDENT ANGLE TO SECOND BEAM CONVERSION UNIT | EMISSION BEAM DIAMETER | BEAM DIAMETER MAGNIFICATION RATIO |
|---|---|---|---|---|---|---|
| 640nm | SLOW AXIS | 0.53mm | | | 1.0mm | 1.9 |
| | FAST AXIS | 1.0mm | 27° | 53° | 0.75mm | 0.75 |
| 488nm | SLOW AXIS | 0.56mm | | | 0.8mm | 1.4 |
| | FAST AXIS | 1.4mm | 18° | 46° | 0.63mm | 0.45 |
| 405nm | SLOW AXIS | 0.6mm | | | 0.78mm | 1.3 |
| | FAST AXIS | 1.3mm | 18° | 43° | 0.47mm | 0.36 |

FIG.8

| WAVELENGTH | BEAM | INCIDENT BEAM DIAMETER | INCIDENT ANGLE TO THIRD BEAM CONVERSION UNIT | INCIDENT ANGLE TO FOURTH BEAM CONVERSION UNIT | EMISSION BEAM DIAMETER | BEAM DIAMETER MAGNIFICATION RATIO |
|---|---|---|---|---|---|---|
| 640nm | SLOW AXIS | 1.0mm | 45° | | 1.4mm | 1.4 |
| | FAST AXIS | 0.75mm | | 32° | 0.67mm | 0.89 |
| 488nm | SLOW AXIS | 0.8mm | 42° | | 0.98mm | 1.2 |
| | FAST AXIS | 0.63mm | | 29° | 0.5mm | 0.79 |
| 405nm | SLOW AXIS | 0.78mm | 33° | | 0.85mm | 1.1 |
| | FAST AXIS | 0.47mm | | 43° | 0.42mm | 0.89 |

488nm

LIGHT SOURCE APPARATUS AND LASER LIGHT SOURCE APPARATUS FOR FLOW CYTOMETER

CROSS-REFERENCE TO RELATED APPLICATION

This application is based on Japanese Patent Application No. 2021-133191, the content of which is incorporated herein by reference.

BACKGROUND

The present disclosure relates to a laser light source apparatus for a flow cytometer, and particularly to a laser light source apparatus for a flow cytometer, adopting a semiconductor laser as the light source. The present disclosure relates to a light source apparatus adopting a semiconductor laser, and which is not limited to the light source apparatus for a flow cytometer.

Conventionally, a technique called flow cytometry is known, in which liquid containing biological microparticles, such as cells and bacteria, and other particles is caused to flow in a flow cell, such as a capillary tube, and the number of these flowing particles and the structure and characteristics thereof are measured and analyzed. Further, various apparatuses for measuring and analyzing particles by this flow cytometry, i.e., flow cytometers are also known, for example, as disclosed in PCT Japanese Publication No. 2013-527929 (Patent Document 1), Japanese Unexamined Patent Publication No. 2017-062247 (Patent Document 2) and Japanese Unexamined Patent Publication No. 2020-073873 (Patent Document 3).

In a flow cytometer, a plurality of particles, as a specimen, are caused to flow in a flow cell configured by a capillary tube or the like in such a manner to follow one after another in a flow direction, and these particles are irradiated with a laser beam from a side of the flow, and scattered light (forward scattered light and side scattered light) and fluorescence induced by the irradiation is detected by a light detector to obtain an electrical signal, and one particle or a group of particles is measured and analyzed based on this electrical signal.

As a light source for emitting a laser beam, a semiconductor laser (laser diode) is often adopted, for example, as described in Patent Document 2, and particularly, a plurality of semiconductor lasers having different oscillation wavelengths from each other are used in some cases. In such a case, a laser beam emitted from each semiconductor laser passes through a focusing lens to focus substantially at the same position in the flow cell.

The beam profile of the laser beam that irradiates microparticles is often a gaussian beam in the flow direction of the particles and a flat profile in a direction perpendicular to the flow direction (see Patent Document 3). In many flow cytometers, liquid containing a plurality of particles is included in a sheath solution in order to cause them to flow in such a manner to follow one after another, as described above.

SUMMARY

The present disclosure is directed to provide a laser light source apparatus for a flow cytometer that can avoid double-counting of particles, as a specimen.

A first laser light source apparatus for a flow cytometer according to an embodiment of the present disclosure is a light source apparatus for a flow cytometer, which is configured to cause a plurality of particles to flow in a flow cell in such a manner to follow one after another in a flow cell length direction and to irradiate the plurality of particles with a laser beam from a side of a flow thereof, the light source apparatus for irradiating the particles with the laser beam, comprising:

a semiconductor laser that is configured to emit the laser beam;

a collimating lens that is configured to collimate the laser beam emitted from the semiconductor laser in a spread light state;

a beam conversion unit that is configured to match the flow cell length direction with a slow axis direction of the laser beam collimated by the collimating lens in the flow cell after reducing the beam diameter of the laser beam in a fast axis direction and increasing the beam diameter in the slow axis direction; and a focusing lens that is configured to focus the laser beam that has passed through the beam conversion unit in the flow cell.

A second laser light source apparatus for a flow cytometer according to an embodiment of the present disclosure can irradiate particles with laser beams having different wavelengths from each other, and it is a light source apparatus for a flow cytometer, which is configured to cause a plurality of particles to flow in a flow cell in such a manner to follow one after another in a flow cell length direction and to irradiate the plurality of particles with the laser beam from a side of a flow thereof, the light source apparatus for irradiating the particles with the laser beam, comprising:

a plurality of semiconductor lasers that is configured to emit laser beams having different wavelengths from each other;

a plurality of collimating lenses that is configured to collimate the laser beams emitted from these plurality of semiconductor lasers each in a spread light state;

a beam conversion unit for each wavelength that is configured to match the flow cell length direction with a slow axis direction of the respective laser beams collimated by the collimating lenses in the flow cell after reducing the beam diameter of each of the laser beams in a fast axis direction and increasing the beam diameter in the slow axis direction;

a beam combiner that is configured to combine the laser beams passed through the beam conversion unit for each wavelength into one; and a focusing lens that is configured to focus the laser beams combined by the beam combiner in the flow cell.

In the second laser light source apparatus for a flow cytometer, it is desirable that an achromatic lens is adopted as the focusing lens. In the second laser light source apparatus for a flow cytometer, it is desirable that the beam conversion unit emits the collimated laser beams having different wavelengths from each other in different directions from each other by a wavelength dispersion function.

In the laser light apparatus for a flow cytometer according to an embodiment of the present disclosure, it is desirable that the beam conversion unit is able to deflect the laser beam in the slow axis direction and in the fast axis direction.

It is desirable that the beam conversion unit, configured in this manner, deflects the laser beam by rotating a prism pair.

In the laser light source apparatus for a flow cytometer according to an embodiment of the present disclosure, it is desirable that the beam conversion unit increases the beam diameter of the laser beam in the slow axis direction to a larger diameter than the reduced beam diameter in the fast axis direction. In the laser light source apparatus for a flow cytometer according to the present disclosure, it is desirable that a beam waist diameter of the laser beam at a focusing position in the flow cell in the slow axis direction of the laser beam is smaller than a beam waist diameter of the laser beam in the fast axis direction.

An embodiment of the present disclosure provides a light source apparatus including the same main part as that of the first laser light source apparatus for a flow cytometer, but the use of which is not limited to the light source for a flow cytometer, and this light source apparatus comprising:

a semiconductor laser that is configured to emit a laser beam;

a collimating lens that is configured to collimate the laser beam emitted from the semiconductor laser in a spread light state;

a beam conversion unit that is configured to match a slow axis direction of the laser beam collimated by this collimating lens with one predetermined direction at a laser beam irradiation position after reducing the beam diameter of the laser beam in a fast axis direction and increasing the beam diameter in the slow axis direction; and a focusing lens that is configured to focus the laser beam passed through this beam conversion unit.

BRIEF DESCRIPTION OF THE DRAWINGS

FIG. 5 is a schematic plan view illustrating the whole shape of a laser light source apparatus for a flow cytometer according to the second embodiment of the present disclosure.

FIG. 6A is a schematic side view illustrating a main part of the light source apparatus illustrated in FIG. 5.

FIG. 6B is a schematic plan view illustrating the main part of the light source apparatus illustrated in FIG. 5.

FIG. 7 is a table showing the specification of a major part of the light source apparatus illustrated in FIG. 5.

FIG. 8 is a table showing the specification of another major part of the light source apparatus illustrated in FIG. 5.

DETAILED DESCRIPTION OF THE PREFERRED EMBODIMENTS

Hereinafter, embodiments of the present disclosure will be described with reference to the drawings.

First Embodiment

Figure 1:
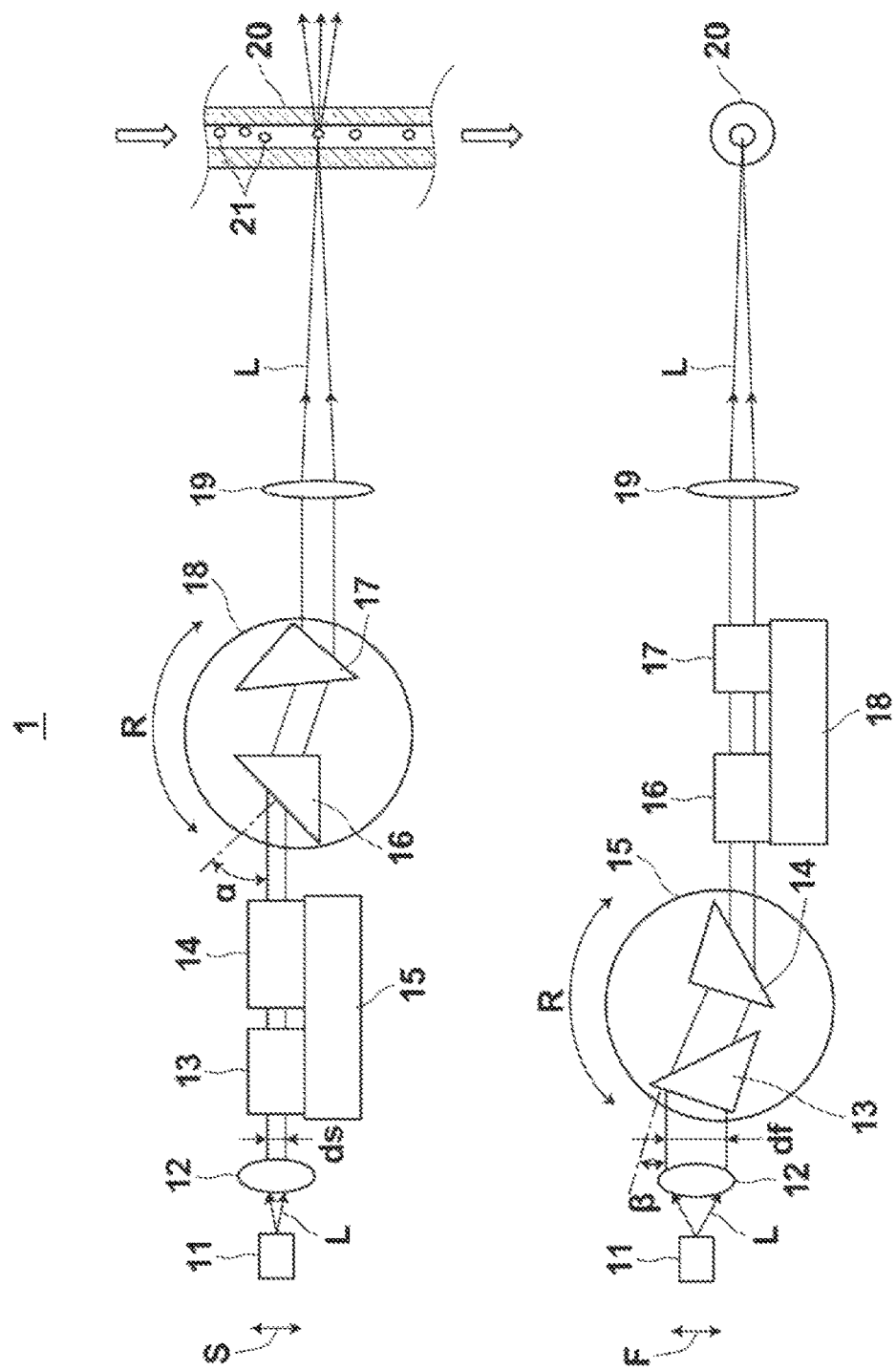
FIG. 1A is a schematic side view illustrating the whole shape of a laser light source apparatus for a flow cytometer according to the first embodiment of the present disclosure.
FIG. 1B is a schematic plan view illustrating the whole shape of the laser light source apparatus for a flow cytometer according to the first embodiment of the present disclosure.
Figure 2:
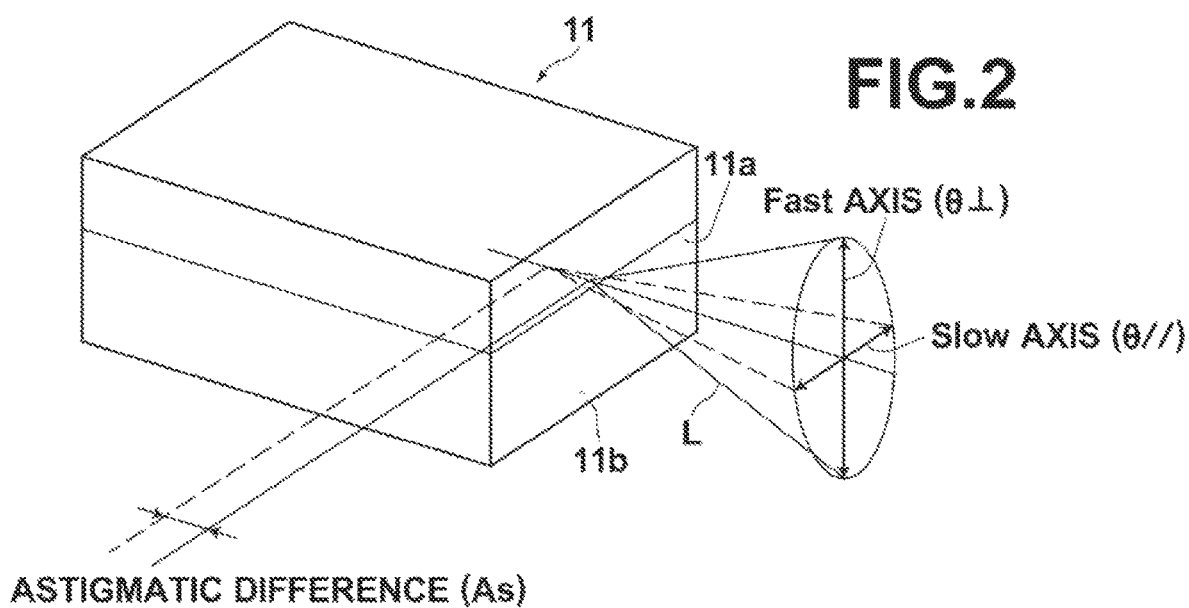
FIG. 2 is a schematic perspective view illustrating the structure of a semiconductor laser.

FIGS. 1A, 1B illustrate a laser light source apparatus 1 for a flow cytometer according to the first embodiment of the present disclosure, and FIG. 1A and FIG. 1B are a schematic side view and a schematic plan view of the light source apparatus 1, respectively. In this light source apparatus 1, one semiconductor laser 11 is adopted as a light source, and FIG. 2 is a schematic perspective view of this semiconductor laser 11. The semiconductor laser 11 has an output power of 60 mW and emits a laser beam L having a wavelength of 488 nm, for example.

As illustrated in FIG. 2, the semiconductor laser 11 emits the laser beam L from an active layer 11a toward an output end surface 11b side in a spread light state. The laser beam L is emitted at dispersion angle θ// in a slow (Slow) axis direction, which is parallel to the active layer 11a, and at dispersion angle θ⊥ in a direction perpendicular to the active layer 11a, i.e., a fast (Fast) axis direction, which is a stacking direction of layers. θ//<θ⊥, and the latter is normally about two or three times as large as the former. The side view and the plan view of FIGS. 1A, 1B illustrate the light source apparatus 1 viewed from a direction perpendicular the slow axis direction indicated by arrow S on the output end surface 11b and from a direction perpendicular to the fast axis direction indicated by arrow F on the output end surface 11b, respectively.

The flow cytometer adopting the light source apparatus 1 of the present embodiment includes a micro flow cell 20, configured by a capillary made of glass or the like, and a plurality of particles 21, as a specimen, are caused to flow in this flow cell 20 in such a manner to follow one after another in a flow cell length direction. Further, the flow cytometer irradiates these particles 21 with the laser beam L from a side of the flow, detects scattered light (forward scattered light and side scattered light) or fluorescence induced by the irradiation by a light detector to obtain an electrical signal and measures and analyzes one particle 21 or a group of particles 21 based on this electrical signal. The laser light source apparatus 1 for a flow cytometer according to the present embodiment is used to irradiate the particles 21 flowing in the flow cell 20 with the laser beam L, as described above.

As illustrated in FIGS. 1A, 1B, the light source apparatus 1 of the present embodiment includes a collimating lens 12 for collimating the laser beam L emitted from the semiconductor laser 11 in a spread light state, prisms 13, 14, 16, 17 through which the collimated laser beam L sequentially passes and a focusing lens 19 for focusing the laser beam L emitted from the prism 17 in the flow cell 20. An aspherical lens is used as the collimating lens 12. Since the aspherical lens can obtain a beam closer to a Gaussian beam, compared with a spherical lens, double-counting of particles is more effectively avoidable.

The prisms 13, 14 are fixed onto a rotary stage 15, which is rotatable in the direction of arrow R, to configure a so-called prism pair. Similarly, the prisms 16, 17 are fixed onto a rotary stage 18, which is rotatable in the direction of arrow R, to configure a so-called prism pair. The prism pair composed of the prisms 13, 14 constitutes a first beam conversion unit, and the prism pair composed of the prisms 16, 17 constitutes a second beam conversion unit. In the present specification, the term "beam conversion unit" refers to an optical unit having a function of changing the beam diameter of a laser beam, and/or, a function of deflecting the laser beam.

More specifically, the prism pair composed of the prisms 13, 14 emits the laser beam L collimated by the collimating lens 12 in such a manner that a beam diameter ds in the slow axis direction is maintained at the same size and a beam diameter df in the fast axis direction is reduced. The prism pair composed of the prisms 13, 14 emits the laser beam L deflected in such a manner that the traveling direction of the laser beam L in a plane including the fast axis changes.

Meanwhile, the laser beam L emitted from the prism 14, which maintained the beam diameter ds in the slow axis direction after passage through the collimating lens 12, is emitted from the prism pair composed of the prisms 16, 17 in such a manner that the beam diameter in the slow axis direction is increased and the beam diameter in the fast axis direction is maintained at the same size. The prism pair composed of the prisms 16, 17 emits the laser beam L deflected in such a manner that the traveling direction of the laser beam L in a plane including the slow axis changes.

Each of the prisms 13, 14, 16, 17 has an apical angle of 45°. As these prisms 13, 14, 16, 17, prisms made of optical glass BK7 are suitably adoptable for example, but other materials, such as molten quartz, are also adoptable.

The laser beam L that has been emitted from the prism 17 and focused by the focusing lens 19 in the flow cell 20 irradiates the plurality of particles 21 flowing in the flow cell 20 in such a manner to follow one after another in a flow cell length direction. Scattered light (forward scattered light and side scattered light) or fluorescence induced by the irradiation is detected by a light detector, which is not illustrated. The flow cytometer measures and analyzes one particle 21 or a group of particles 21 based on an electrical detection signal output by the light detector at this time.

In the laser light source apparatus 1 for a flow cytometer of the present embodiment, the laser beam L focusing in the flow cell 20 irradiates an inside of the flow cell 20 in such a manner that the length direction of the flow cell 20 (the flow direction of the particles 21) is matched with the slow axis, as clearly illustrated in FIG. 1A. As a result, double-counting of the same particle 21 in the flow cytometer is avoided. Next, this feature will be described in detail.

The beam waist diameter of the laser beam L at a focusing position in the flow cell 20 needs to be sufficiently small in a flow direction to avoid double-counting of the particles 21 flowing in the flow cell 20 in such a manner to follow one after another in the flow direction. That is because otherwise two particles 21 flowing close to each other may be counted as one particle. In contrast, a beam waist diameter in a direction perpendicular to the flow direction needs to be large to some extent to prevent the particles 21 from being unirradiated with the laser beam L and uncounted. In many flow cytometers for analyzing biological microparticles, as the specimen, the former beam waist diameter needs to be about 10 μm or less, and the latter beam waist diameter needs to be from 60 to 100 μm or larger, for example.

Meanwhile, when the laser beam L is focused by the focusing lens 19, the beam waist diameter becomes smaller as the beam diameter before entering the focusing lens 19 is larger. Specifically, the beam diameter $2\omega$ of a laser beam having a wavelength $\lambda$ is $2\omega = 4/\pi \cdot f\lambda/D$ when the laser beam having a wavelength $\lambda$ is focused by a lens having a focal length f.

In view of the foregoing, it would be desirable that the laser beam L before focusing is positioned in such a manner that the fast axis is matched with the flow direction of particles as the optical system can be simplified, as clearly illustrated in FIG. 2. However, the inventor of the present disclosure has found that a beam profile of the laser beam in the fast axis direction tends to have disturbance, such as a protrusion, which causes double-counting of particles.

Figures 3A, 3B, 3C, 3D:
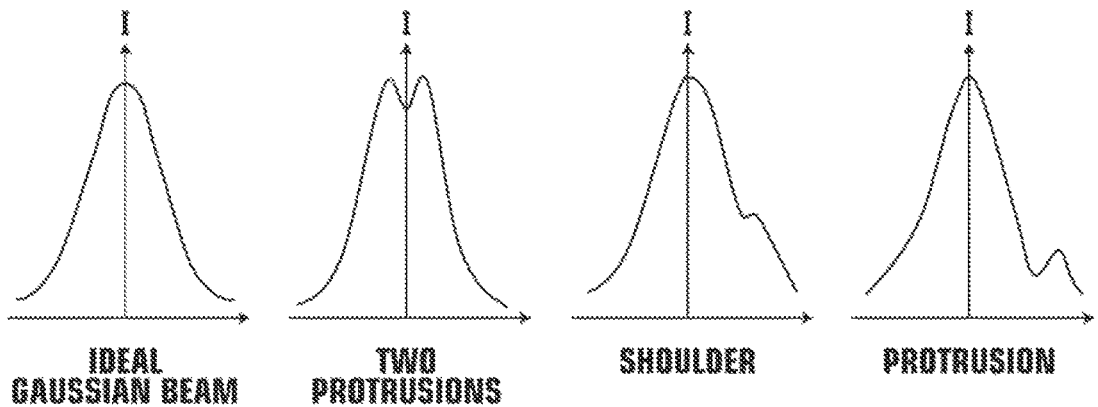
FIG. 3A is a schematic diagram illustrating an example of a beam profile in a fast axis direction of a laser beam emitted by a semiconductor laser.
FIG. 3B is a schematic diagram illustrating an example of a beam profile in the fast axis direction of a laser beam emitted by a semiconductor laser.
FIG. 3C is a schematic diagram illustrating an example of a beam profile in the fast axis direction of a laser beam emitted by a semiconductor laser.
FIG. 3D is a schematic diagram illustrating an example of a beam profile in the fast axis direction of a laser beam emitted by a semiconductor laser.

FIGS. 3A through 3D illustrate examples of these beam profiles in the fast axis direction. In FIGS. 3A through 3D, the horizontal axis represents a position in the fast axis direction, and the vertical axis represents a beam intensity I. FIG. 3A illustrates a beam profile of an ideal Gaussian beam shape. Meanwhile, FIG. 3B illustrates a beam profile with two protrusions on both sides of a center of the profile, FIG. 3C illustrates a beam profile with a shoulder at an end of the profile and FIG. 3D illustrates a beam profile with one protrusion at an end of the profile.

When disturbance, such as a protrusion, occurs in a beam profile of a laser beam L along the flow direction of the particles 21 as described above, a detection signal of the aforementioned detector for detecting scattered light or fluorescence varies due to the disturbance. Further, the variation is recognized as what is originated from a particle 21 that is not actually present, and double-counting occurs. For example, when two protrusions are present in a beam profile of the laser beam L, one particle 21 may be judged as two particles. Such double-counting may occur even when a protrusion with the intensity of about 1 to 2% of the original beam intensity I of the laser beam L is generated.

Based on these findings, in the present embodiment, the slow axis direction of the laser beam L is matched with the flow cell length direction (particle flow direction) in the flow cell 20 by the first beam conversion unit composed of the prisms 13, 14 and the second beam conversion unit composed of the prisms 16, 17. As a result, double-counting caused by disturbance, such as a protrusion, of the beam profile in the fast axis direction is avoidable.

In the present embodiment, the laser beam L collimated by the collimating lens 12 passes through the focusing lens 19 to focus in the flow cell 20 after the beam diameter is reduced in the fast axis direction and increased in the slow axis direction by the first beam conversion unit and the second beam conversion unit. Specifically, with respect to the slow axis direction, the beam diameter of the laser beam L after having passed through the collimating lens 12 is beam diameter ds=0.56 mm, and this laser beam L enters the prism 16 at an incident angle $\alpha=56°$ and the laser beam L with a diameter of 3 mm is emitted from the prism 17 (Magnification Rate Ms=5.4). With respect to the slow axis direction, since the laser beam L after having passed through the collimating lens 12 perpendicularly enters the first beam conversion unit, the beam diameter ds=0.56 mm is maintained substantially at the same size in the first beam conversion unit.

Meanwhile, with respect to the fast axis direction, the beam diameter of the laser beam L after having passed through the collimating lens 12 is beam diameter df=1.4 mm, and this laser beam L enters the prism 13 at an incident angle $\beta=23°$ and the laser beam L with a diameter of 0.5 mm is emitted from the prism 14 (Magnification Rate Ms=0.36). With respect to the fast axis direction, since the laser beam L after having passed through the prism 14 perpendicularly enters the second beam conversion unit, the beam diameter=0.5 mm is maintained substantially at the same size in the second beam conversion unit. Note that the aforementioned beam diameter and beam waist diameter, which will be described later, are defined by $1/e^2$ diameter.

Specifically, the laser beam L before entering the focusing lens 19 having a focal length f=50 mm has a beam diameter of 3 mm in the slow axis direction and a beam diameter of 0.5 mm, which is smaller than 3 mm, in the fast axis direction. As a result, a beam waist diameter of the laser beam L focused by the focusing lens 19 is 10 μm, which is relatively small, in the slow axis direction and 60 μm, which is relatively large, in the fast axis direction at a focusing position in the flow cell 20.

As described above, in the present embodiment, a beam waist diameter of about 60 to 100 μm or higher in the fast axis direction, as stated above, and a beam waist diameter of about 10 μm or less in the slow axis direction, as stated above, at the focusing position are easily achieved. Further, since the first beam conversion unit and the second beam conversion unit, which can achieve such an effect and avoid double-counting as described above, are configured by simple prism pairs, respectively, the optical system is easily designed, produced and adjusted in the present embodiment, and the cost of the optical system is low.

When a gas laser or the like other than the semiconductor laser is adopted as the light source and a laser beam having a beam cross-section of a substantially true circle is focused in the flow cell 20, a beam waist diameter in the particle flow direction and a beam waist diameter in a direction perpendicular to the particle flow direction may be varied by focusing the laser beam, for example, by using a cylindrical lens. However, the cylindrical lens is difficult to process and expensive, and further, complicated adjustment is needed to use the cylindrical lens.

In the present embodiment, the prism pair (prisms 16, 17), as the second beam conversion unit, is fixed onto the rotary stage 18. Therefore, the laser beam L emitted from this second beam conversion unit is deflectable in the slow axis direction by rotating the rotary stage 18 in the direction of arrow R. Similarly, the prism pair (prisms 13, 14), as the first beam conversion unit, is fixed onto the rotary stage 15. Therefore, the laser beam L emitted from this first beam conversion unit is deflectable in the fast axis direction by rotating the rotary stage 15 in the direction of arrow R.

Figure 4:
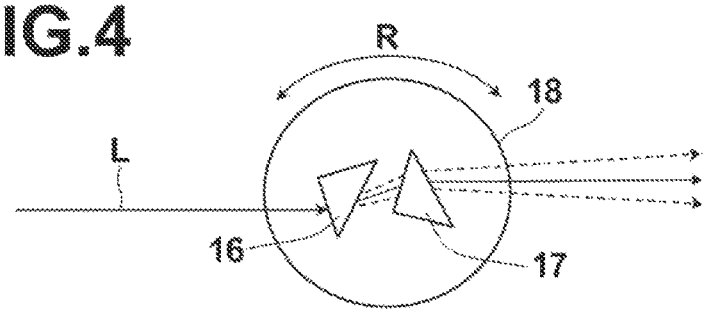
FIG. 4 is a schematic side view illustrating a part of the laser light source apparatus of the flow cytometer illustrated in FIGS. 1A, 1B.

The present embodiment will be specifically described with reference to the schematic diagram illustrated in FIG. 4, and the laser beam L emitted from the second beam conversion unit is deflectable in the slow axis direction in such a manner that the direction of the laser beam L changes±0.2° (as indicated by broken lines in FIG. 4) by rotating the rotary stage 18 in the direction of arrow R by ±1°. The rotation amount of the rotary stage 15 and the direction of deflection of the laser beam L in the fast axis direction, as described above, are also similar to this.

It is possible to make the laser beam L focus at a central position in the flow cell 20 by deflecting the laser beam L in the fast axis direction as described above. It is possible to adjust the focusing position of the laser beam L in the particle flow direction by deflecting the laser beam L in the slow axis direction. It is possible to increase the intensity of the scattered light or fluorescence from the particles 21 as the focusing position of the laser beam L is adjustable both in the flow direction of the particles 21 and in a direction crossing this direction, as described above. Therefore, since it is possible to also increase the intensity of a detection signal from the light detector for detecting such light, it is possible to eliminate variation in signals between individual flow cytometers, and highly reliable detection of signals becomes possible. The laser beam L may be deflectable in only one of the slow axis direction and the fast axis direction.

Second Embodiment

Next, with reference to FIGS. 5 through 17, a laser light source apparatus 2 for a flow cytometer according to the second embodiment of the present disclosure will be described. In these diagrams, the same numbers are assigned to elements similar to those described already, and explanation thereof will be omitted unless necessary.

FIG. 5 is a schematic diagram illustrating the laser light source apparatus 2 for a flow cytometer according to the second embodiment of the present disclosure, and FIG. 6A is a schematic side view and FIG. 6B is a schematic plan view of a main part of the light source apparatus 2. Three semiconductor lasers 31, 51, 71 are adopted as the light source in this light source apparatus 2. The semiconductor laser 31 has an output power of 100 mW and emits a laser beam L1 having a wavelength of 640 nm, for example. The semiconductor laser 51 has an output power of 60 mW and emits a laser beam L2 having a wavelength of 488 nm similar to the semiconductor laser 11, used in the first embodiment. The semiconductor laser 71 has an output power of 60 mW, and emits a laser beam L3 having a wavelength of 405 mm, for example.

The laser beam L1 emitted from the semiconductor laser 31 in a spread light state is collimated by a collimating lens 32, and the collimated laser beam L1 sequentially passes through a first beam conversion unit 33, a second beam conversion unit 34, a third beam conversion unit 35 and a fourth beam conversion unit 36. Similarly, the laser beam L2 emitted from the semiconductor laser 51 in a spread light state is collimated by a collimating lens 52, and the collimated laser beam L2 sequentially passes through a first beam conversion unit 53, a second beam conversion unit 54, a third beam conversion unit 55 and a fourth beam conversion unit 56. Further, the laser beam L3 emitted from the semiconductor laser 71 in a spread light state is collimated by a collimating lens 72, and the collimated laser beam L3 sequentially passes through a first beam conversion unit 73, a second beam conversion unit 74, a third beam conversion unit 75 and a fourth beam conversion unit 76. Aspherical lenses are used as the collimating lenses 32, 52, 72. Since a beam closer to a Gaussian beam is obtainable by using the aspherical lens, compared with a spherical lens, double-counting is more effectively avoidable.

FIG. 5 schematically illustrates all of the 12 beam conversion units 33 through 76, but FIGS. 6A, 6B particularly illustrate the configuration of the first beam conversion unit 53 and the second beam conversion unit 54 in detail. As illustrated in FIGS. 6A, 6B, the first beam conversion unit 53 is configured by a prism pair composed of prisms 53a, 53b in a similar manner to the first beam conversion unit configured by the prisms 13, 14 in the first embodiment. Similarly, the second beam conversion unit 54 is also configured by a prism pair composed of prisms 54a, 54b in a similar manner to the second beam conversion unit configured by the prisms 16, 17 in the first embodiment. Although FIGS. 6A, 6B omit illustration, the prism pair composed of prisms 53a, 53b is fixed onto a rotary stage similar to the rotary stage 15 illustrated in FIGS. 1A, 1B, and the prism pair composed of prisms 54a, 54b is fixed onto a rotary stage similar to the rotary stage 18 illustrated in FIGS. 1A, 1B. Further, the laser beam L2 is deflectable both in the fast axis direction and in the slow axis direction by rotating each of the rotary stages.

Although FIGS. 6A, 6B omit illustration, the third beam conversion unit 55, following the second beam conversion unit 54 (see FIG. 5), is configured by a prism pair composed of two prisms similar to the first beam conversion unit 53, and the fourth beam conversion unit 56, following the third beam conversion unit 55 (see FIG. 5), is configured by a prism pair composed of two prisms similar to the second beam conversion unit 54. Further, the third beam conversion unit 55 and the fourth beam conversion unit 56 are also fixed onto rotary stages in a similar manner to the aforementioned configuration, and the laser beam L2 is deflectable both in the fast axis direction and in the slow axis direction by rotating each of the rotary stages.

In the first embodiment, the laser beam L is deflectable in the fast axis direction and in the slow axis direction by the first and second beam conversion units, but in this second embodiment, the laser beam L2 is deflected in the fast axis direction in two steps by the first and third beam conversion units and in the slow axis direction in two steps by the second and fourth beam conversion units. Since the laser beam L2 is deflected in two steps in each axial direction in this manner, it is possible to reduce a deflection angle by each beam conversion unit to finally obtain the same deflection angle as the deflection angle obtained by deflection in one step.

This may ease the magnitude of change in the direction of the laser beam L2 emitted from each of the first through fourth beam conversion units relative to rotation of the rotary stages. For example, in the first embodiment, it is possible to configure the second beam conversion unit in such a manner that the direction of the laser beam L emitted from the second beam conversion unit changes±0.2° by rotating the rotary stage 18 in the direction of arrow R by ±1°, as described already, but in the second embodiment, it is possible to configure the first through fourth beam conversion units in such a manner that the direction of the laser beam L2 emitted from each of the beam conversion units changes±0.05° by rotating each rotary stage by ±1°. Therefore, it is possible to adjust the beam conversion units during production and use more easily and accurately.

In the above descriptions, the first beam conversion unit 53, the second beam conversion unit 54, the third beam conversion unit 55 and the fourth beam conversion unit 56 provided for the laser beam L2 having a wavelength of 488 nm were explained, but the first beam conversion unit 33, the second beam conversion unit 34, the third beam conversion unit 35, and the fourth beam conversion unit 36 provided for the laser beam L1 having a wavelength of 640 nm are configured basically in a similar manner to the beam conversion units 53, 54, 55, 56, respectively. The first beam conversion unit 73, the second beam conversion unit 74, the third beam conversion unit 75, and the fourth beam conversion unit 76 provided for the laser beam L3 having a wavelength of 405 nm are also configured basically in a similar manner to the beam conversion units 53, 54, 55, 56, respectively.

Here, FIG. 7 shows a beam diameter (a collimated beam diameter) before entering the first beam conversion unit, incident angles to the first and second beam conversion units, an emission beam diameter when the laser beam is emitted from the second beam conversion unit and a beam diameter magnification ratio, which is a ratio of the emission beam diameter to the collimated beam diameter, for each of the laser beam L1 having a wavelength of 640 nm, the laser beam L2 having a wavelength of 488 nm and the laser beam L3 having a wavelength of 405 nm in the slow axis and fast axis directions.

Similarly, FIG. 8 shows an incident beam diameter when the laser beam enters the third beam conversion unit (which is an emission beam diameter when the laser beam is emitted from the second conversion unit), incident angles to the third and fourth beam conversion units, an emission beam diameter when the laser beam is emitted from the fourth beam conversion unit and a beam diameter magnification ratio, which is a ratio of the emission beam diameter to the incident beam diameter, for each of the laser beam L1 having a wavelength of 640 nm, the laser beam L2 having a wavelength of 488 nm and the laser beam L3 having a wavelength of 405 nm in the slow axis and fast axis directions.

As illustrated in FIG. 5, the laser beam L1 emitted from the fourth beam conversion unit 36 is reflected by a first mirror 37, and combined with the laser beam L2 emitted from the fourth beam conversion unit 56 by a first beam combiner 57. The combined laser beams L1, L2 are combined with the laser beam L3 emitted from the fourth beam conversion unit 76 by a second beam combiner 77. The combined laser beams L1, L2, L3 pass through a fifth beam conversion unit 80 and are reflected by a second mirror 81 and then pass through a sixth beam conversion unit 82 and a focusing lens 83. The laser beams L1, L2, L3 are focused by the focusing lens 83 so as to focus in the flow cell 20.

The laser beams L1, L2, L3 focused in the flow cell 20 irradiate the plurality of particles flowing in the flow cell length direction (the flow direction of particles, which is a direction perpendicular to the paper in FIG. 5) in such a manner to follow one after another in the flow cell 20 also in the present embodiment. Scattered light (forward scattered light and side scattered light) or fluorescence induced by the irradiation is detected by a light detector, which is not illustrated. The flow cytometer measures and analyzes one particle or a group of particles based on an electrical detection signal output by the light detector at this time.

The fifth beam conversion unit 80 and the sixth beam conversion unit 82 are configured by prism pairs similar to each of the aforementioned beam conversion units. The laser beams L1, L2, L3 that have been combined by the second beam combiner 77 and passed through the fifth beam conversion unit 80 are separated by wavelength dispersion by the prisms so as to form, for example, an angle of about 0.2° to each other with the laser beam L2 having a wavelength of 488 nm as a center. In such a case, the beam diameter of each of the laser beams L1, L2, L3 becomes about three times as large by the fifth beam conversion unit 80, thereby the beam diameter in the slow axis direction becomes about 3 mm.

In the sixth beam conversion unit 82, angles formed by the laser beams L1, L2, L3, each diameter of which has been increased together as described above, to each other in the length direction of the flow cell 20 (the flow direction of the particles 21) are adjusted. Then, the laser beams L1, L2, L3 pass through the focusing lens 83 and focus in the flow cell 20. The slow axis direction of the laser beams L1, L2, L3 is matched with the length direction of the flow cell 20 (the flow direction of particles) also in the present embodiment. As a result, a similar effect to the first embodiment is achievable.

Figure 9:
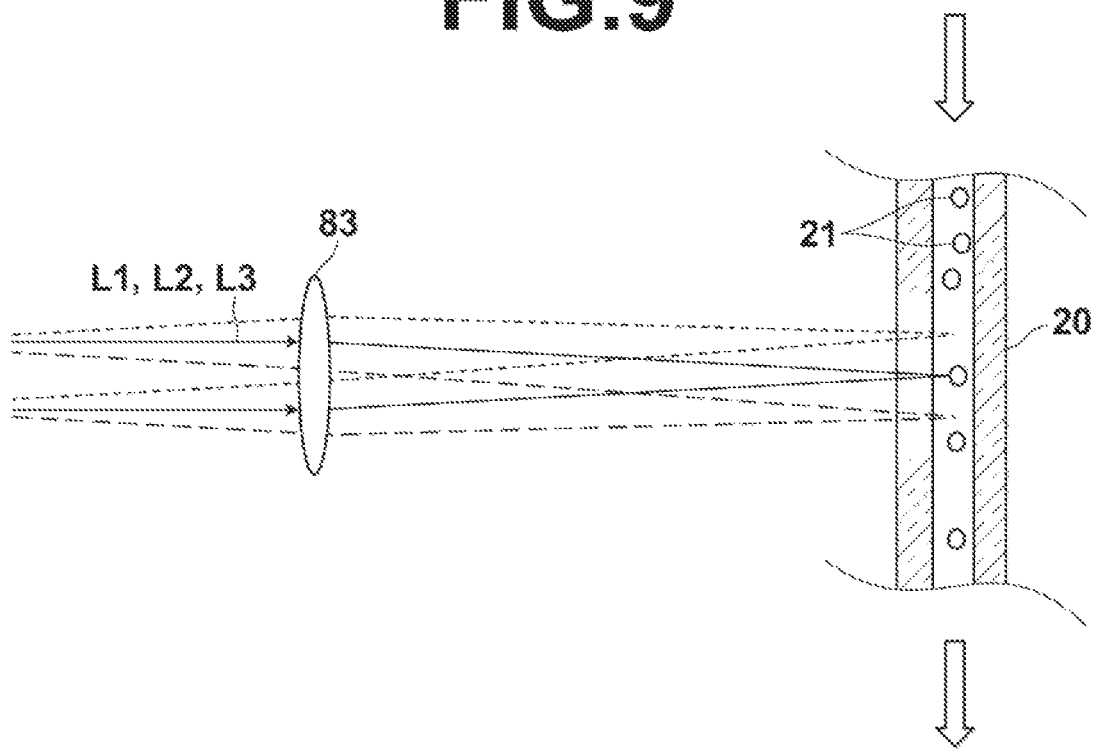
FIG. 9 is a schematic side view illustrating a part of the light source apparatus illustrated in FIG. 5.

The beam waist diameters of the laser beams L1, L2, L3 focusing in the flow cell 20 are 10 µm, which is relatively small, in the slow axis direction and 60 µm, which is relatively large, in the fast axis direction perpendicular to this direction. FIG. 5 schematically illustrates beam profiles in the slow axis direction and the fast axis direction on the right side and the upper side of the flow cell 20, respectively. FIG. 9 illustrates the laser beams L1, L2, L3 that have passed through the focusing lens 83 and focused in the flow cell 20 from a side of the flow cell 20.

Figure 10A:
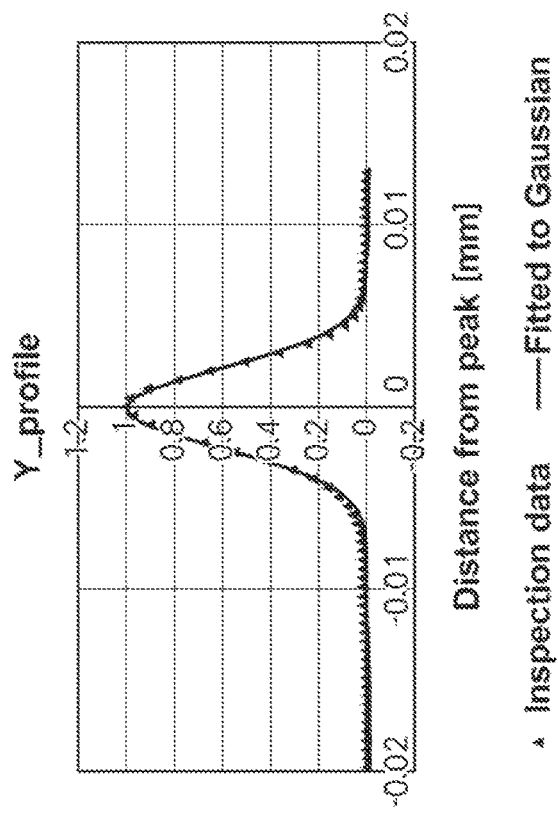
FIG. 10A is a diagram illustrating a beam profile of a laser beam having a wavelength of 640 nm in the light source apparatus illustrated in FIG. 5.
Figure 10B:
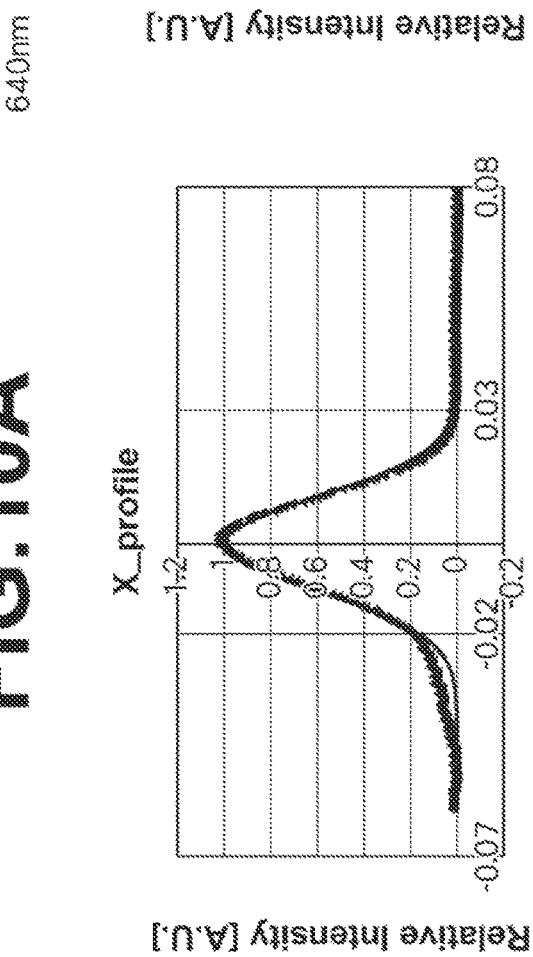
FIG. 10B is a diagram illustrating a beam profile of the laser beam having the wavelength of 640 nm in the light source apparatus illustrated in FIG. 5.
Figure 11A:
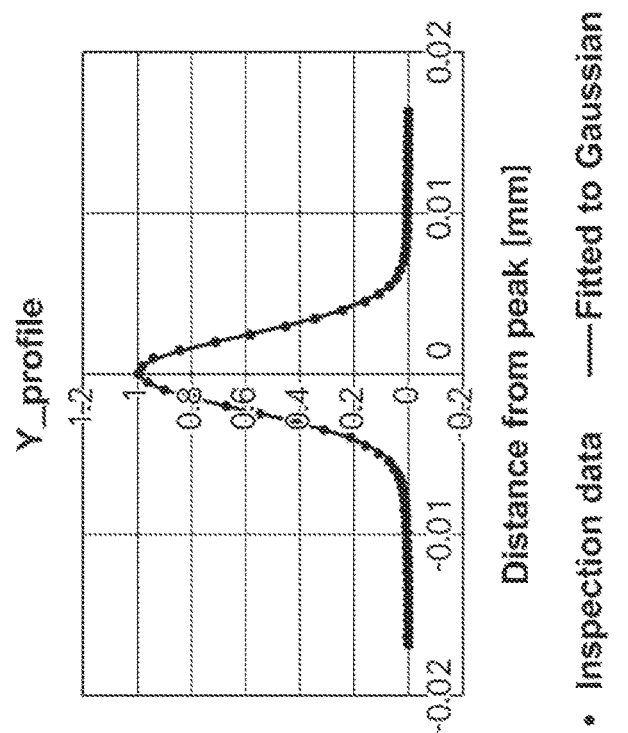
FIG. 11A is a diagram illustrating a beam profile of a laser beam having a wavelength of 488 nm in the light source apparatus illustrated in FIG. 5.
Figure 11B:
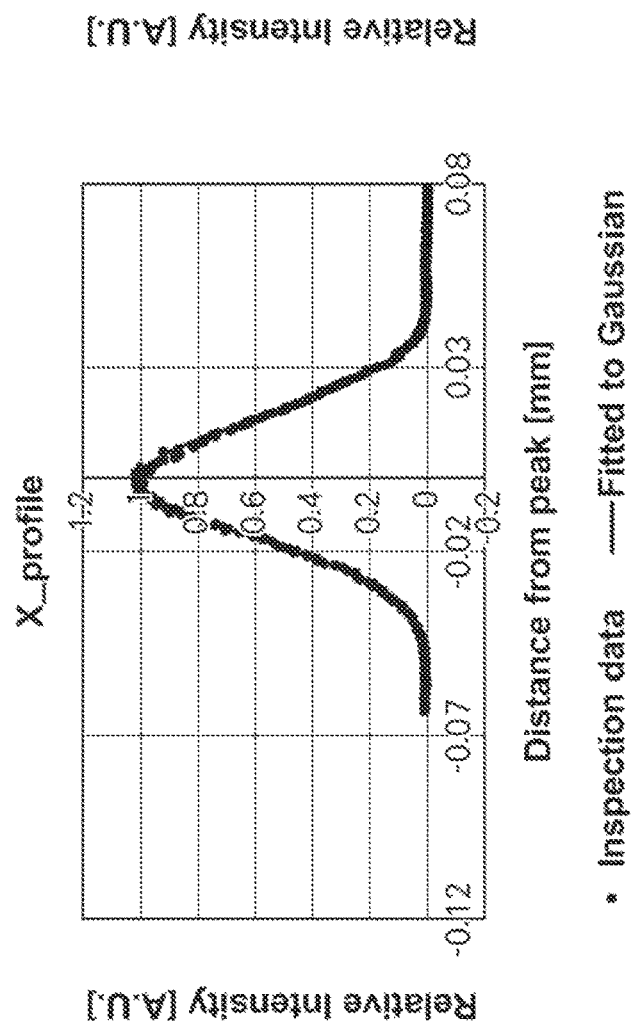
FIG. 11B is a diagram illustrating a beam profile of the laser beam having the wavelength of 488 nm in the light source apparatus illustrated in FIG. 5.
Figure 12A:
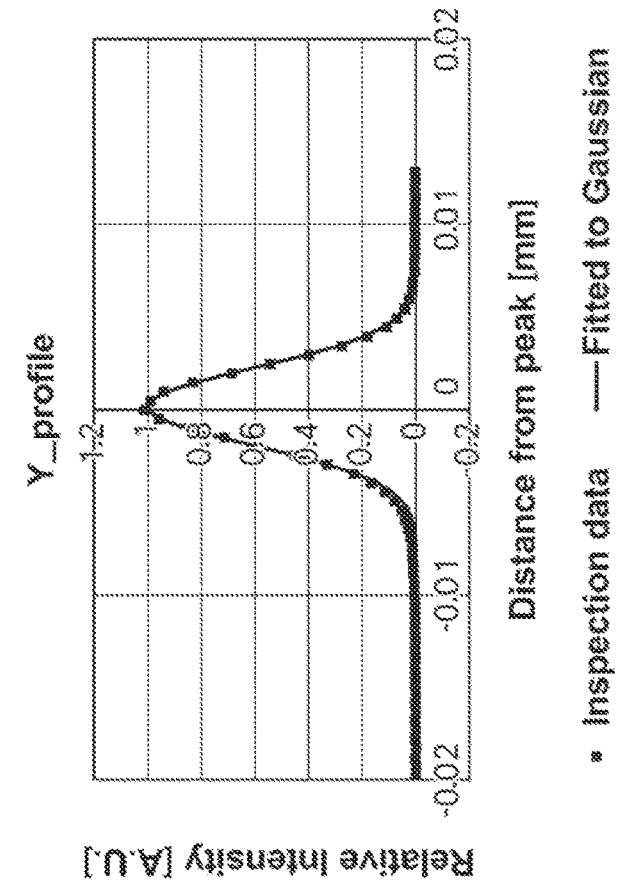
FIG. 12A is a diagram illustrating a beam profile of a laser beam having a wavelength of 405 nm in the light source apparatus illustrated in FIG. 5.
Figure 12B:
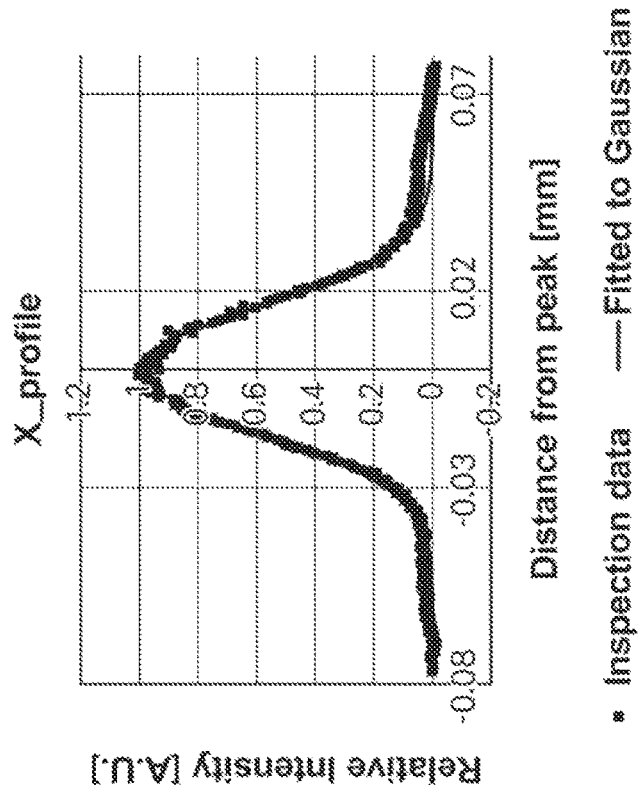
FIG. 12B is a diagram illustrating a beam profile of a laser beam having the wavelength of 405 nm in the light source apparatus illustrated in FIG. 5.

FIGS. 10A, 10B, FIGS. 11A, 11B and FIGS. 12A, 12B illustrate the results of measuring the beam profiles of the laser beams L1, L2, L3 having the wavelengths of 640 nm, 488 nm and 405 nm, respectively, at the focusing position. In the diagrams, FIGS. 10A, 11A and 12A are beam profiles in the fast axis direction and FIGS. 10B, 11B and 12B are beam profiles in the slow axis direction. In FIGS. 10A through 12B, measured values are plotted, and profiles of ideal Gaussian beams fitting the plots are indicated by curved lines. The beam waist diameters in the fast axis direction and the slow axis direction at the focusing position are 42 µm and 9 µm for the laser beam L1, 64 µm and 9 µm for the laser beam L2 and 63 µm and 8 µm for the laser beam L3.

In the present embodiment, an achromatic lens is used as the focusing lens 83. This achromatic lens is, for example, a cemented lens of three lens elements with a focal length of 50 mm in which the chromatic dispersion is corrected for the wavelengths of 640 nm, 488 nm, and 405 nm. The laser beams L1, L2, L3 can focus at the same position in the direction of the diameter of the flow cell in the flow cell 20 regardless of the difference in the wavelength by passing the beams through such a focusing lens 83. Meanwhile, in the present embodiment, each of the laser beams L1, L2, L3 focuses in such a manner that they are separate from each other in the length direction of the flow cell 20 by a distance of 170 µm between beam centers thereof and positioned one after another in a straight line. It is possible to distinguish and accurately detect the scatter light and fluorescence from the laser beams L1, L2, L3, having different wavelengths from each other, by focusing the laser beams L1, L2, L3 to be separate from each other in this manner.

When the achromatic lens is not adopted, some of the laser beams having the three wavelengths may focus with a beam waist diameter greater than 10 µm. For example, the achromatic lens of three lens elements, as described above, is relatively easily obtainable as its production technique has been conventionally established.

Before the laser beams are combined, the dispersion angles that differ in each semiconductor laser are adjusted, i.e., the laser beam L1 is adjusted by the first through fourth beam conversion units (33 through 36), the laser beam L2 is also adjusted by the first through fourth beam conversion units (53 through 56) and the laser beam L3 is also adjusted by the first through fourth beam conversion units (73 through 76) to obtain a desirable beam diameter. Since the laser beams L1, L2, L3 enter the fifth beam conversion unit 80 and the sixth beam conversion unit 82 after then, the laser beams L1, L2, L3 can accurately focus in the flow cell 20, as described above, and adjustment by the beam conversion units can be simplified.

In the described second embodiment, three semiconductor lasers 31, 51, 71, which emit laser beams L1, L2, L3 having wavelengths of 640 nm, 488 nm and 405 nm, respectively, are used, but a plurality of semiconductor lasers emitting laser beams having wavelengths other than these wavelengths, and which are different from each other, may be used in the present disclosure. The number of such plurality of semiconductor lasers may be other than three.

Now, with reference to FIGS. 13 through 17, examples using a mechanism for deflecting a laser beam other than the rotary stage will be described. These examples of mechanism are not only to deflect each of a plurality of laser beams particularly having different wavelengths from each other, but applicable to deflect one laser beam having a single wavelength.

Figure 13:
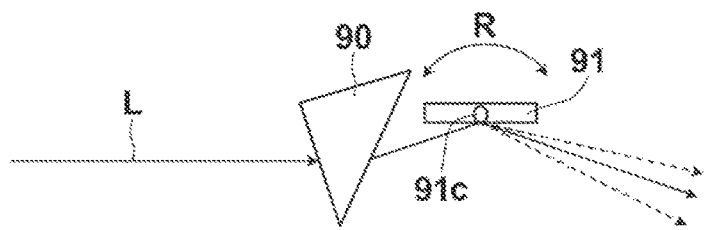
FIG. 13 is a schematic diagram illustrating an example of a mechanism for deflecting a laser beam.

A deflecting mechanism illustrated in FIG. 13 is configured by a prism 90 for refracting a laser beam L and a mirror 91 for reflecting the refracted laser beam L at one surface thereof (the lower surface in FIG. 13), and the mirror 91 is rotatable in the direction of arrow R about a rotation shaft 91c parallel to the one surface. Therefore, the reflected laser beam L is deflectable, as indicated by broken lines in FIG. 13, by rotating the mirror 91 as described.

Figure 14:
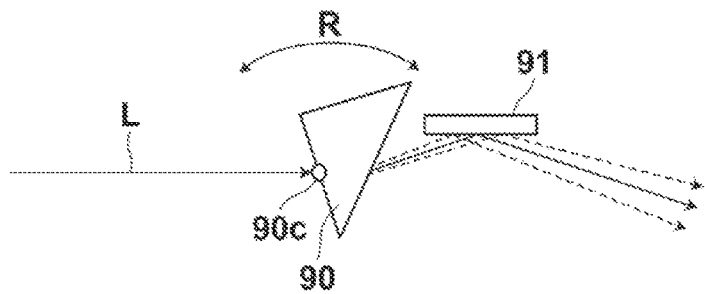
FIG. 14 is a schematic diagram illustrating another example of a mechanism for deflecting a laser beam.

Next, a deflecting mechanism illustrated in FIG. 14 is configured by a prism 90 for refracting a laser beam L and a mirror 91 for reflecting the refracted laser beam L at one surface thereof (the lower surface in FIG. 14), and in this mechanism, the prism 90 is rotatable in the direction of arrow R about a rotation shaft 90c parallel to the longitudinal direction of the laser beam L. Therefore, the laser beam L reflected by the mirror 91 is deflectable, as indicated by broken lines in FIG. 14, by rotating the prism 90 as described. The prism 90 illustrated in FIG. 14 and FIG. 13 may be one of prisms constituting a prism pair, as described above, or provided alone.

Figure 15:
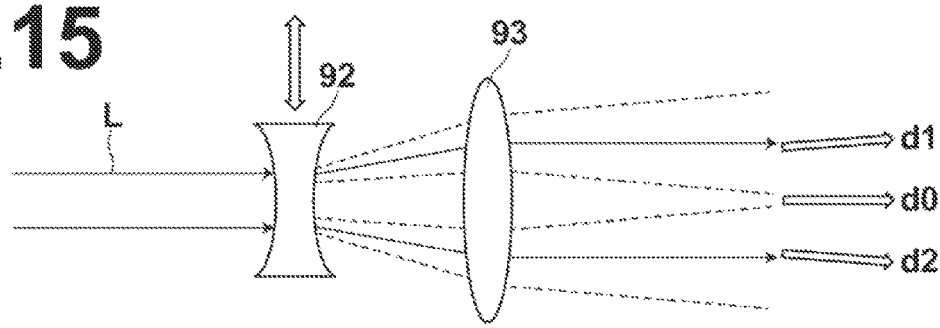
FIG. 15 is a schematic diagram illustrating another example of a mechanism for deflecting a laser beam.

A deflecting mechanism illustrated in FIG. 15 is configured by a concave lens 92, which a laser beam L enters, and a convex lens 93, which substantially collimates the laser beam L that has become spread light by passing through this concave lens 92, and the concave lens 92 is movable in a direction perpendicular to an optical axis. When the concave lens 92 is positioned in such a manner that its optical axis is matched with a beam center of the laser beam L, the laser beam L is emitted from the convex lens 93 in the direction indicated by arrow d0. The laser beam L emitted from the convex lens 93 is deflectable in the directions indicated by arrow d1 and arrow d2 by moving the concave lens 92 from this state to the aforementioned direction. In this mechanism, for example, when the focal lengths of the concave lens 92 and the convex lens 93 are 10 mm and 20 mm, respectively, the beam diameter of the laser beam L emitted from the convex lens 93 becomes twice as large as that of the laser beam L before entering the concave lens 92.

Figure 16:
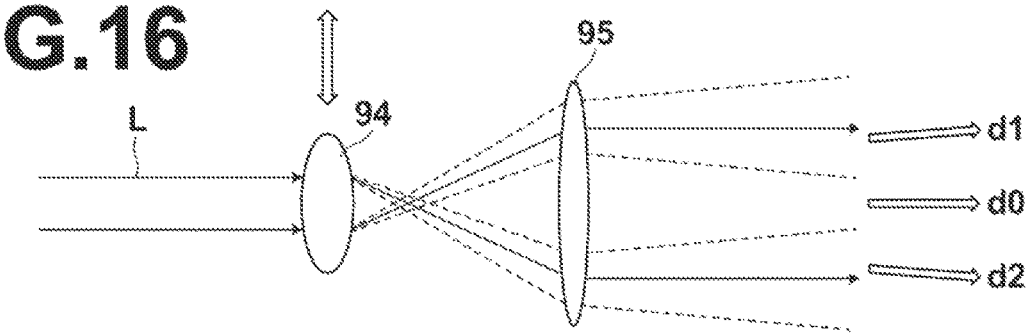
FIG. 16 is a schematic diagram illustrating another example of a mechanism for deflecting a laser beam.

A deflecting mechanism illustrated in FIG. 16 is configured by a first convex lens 94, which a laser beam L enters, and a second convex lens 95, which substantially collimates the laser beam L that has become spread light after being focused by passing through this first convex lens 94, and the first convex lens 94 is movable in a direction perpendicular to an optical axis. When the first convex lens 94 is positioned in such a manner that its optical axis is matched with a beam center of the laser beam L, the laser beam L is emitted from the second convex lens 95 in the direction indicated by arrow d0. The laser beam L emitted from the second convex lens 95 is deflectable in the directions indicated by arrow d1 and arrow d2 by moving the first convex lens 94 from this state to the aforementioned direction. In this mechanism, for example, when the focal lengths of the first convex lens 94 and the second convex lens 95 are 10 mm and 20 mm, respectively, the beam diameter of the laser beam L emitted from the second convex lens 95 becomes twice as large as that of the laser beam L before entering the first convex lens 94.

Figure 17:
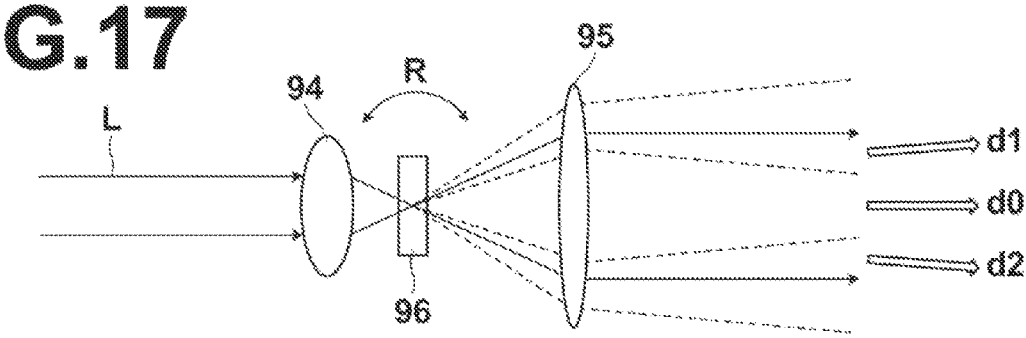
FIG. 17 is a schematic diagram illustrating another example of a mechanism for deflecting a laser beam.

The deflecting mechanism illustrated in FIG. 17 is configured by a transparent parallel flat plate 96 positioned substantially at a focusing position of a laser beam L by the first convex lens 94, in addition to the first convex lens 94 and the second convex lens 95 similar to those in the mechanism of FIG. 16. The parallel flat plate 96 is formed, for example, from optical glass BK7, and rotatable substantially about the focusing position in the direction of arrow R in FIG. 17. When the parallel flat plate 96 is positioned in such a manner that the laser beam L enters the parallel flat plate 96 substantially perpendicularly, the laser beam L is emitted from the second convex lens 95 in the direction indicated by arrow d0. The laser beam L emitted from the second convex lens 95 is deflectable in the directions indicated by arrow d1, arrow d2 or the like by rotating the parallel flat plate 96 from this state in the direction of arrow R.

Third Embodiment

This third embodiment is an embodiment of a light source apparatus of the present disclosure, which is not limited to use for a flow cytometer. The configuration of this light source apparatus is similar to the laser light source apparatus 1 for a flow cytometer, illustrated in FIGS. 1A, 1B, but a subject to be irradiated with a laser beam L is not the flow cell 20, illustrated in FIGS. 1A, 1B, but a portion to be treated by a laser beam machining apparatus for performing microfabrication, for example.

Figure 18A:
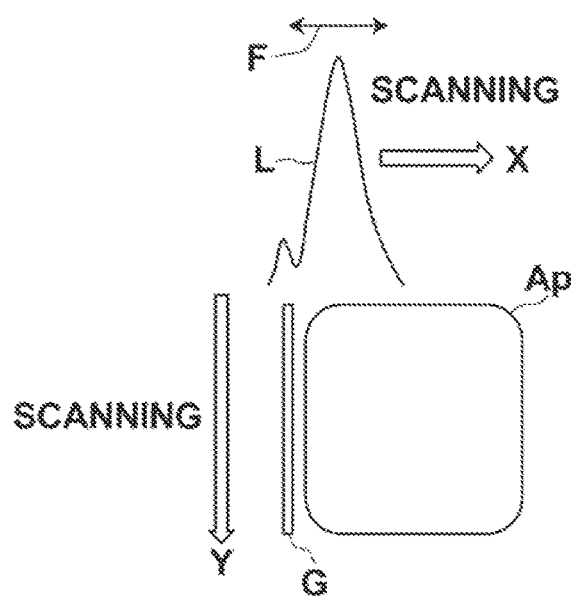
FIG. 18A is a schematic diagram for explaining the action of a light source apparatus according to the third embodiment of the present disclosure.
Figure 18B:
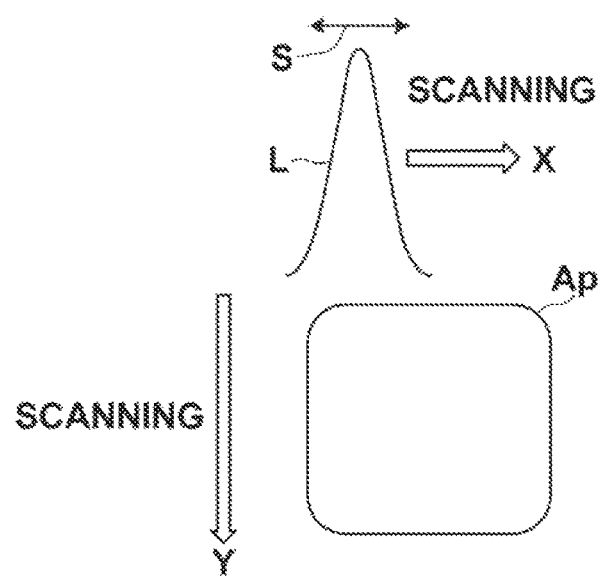
FIG. 18B is a schematic diagram for explaining the action of the light source apparatus according to the third embodiment of the present disclosure.

This laser beam machining apparatus performs microfabrication on a portion to be treated by two-dimensionally scanning the portion with the laser beam L. FIGS. 18A, 18B illustrate a partial region Ap to be treated in the portion to be treated, and this region Ap to be treated is scanned with the laser beam L in a main scan direction and a sub scan direction, indicated by broad arrows X and Y, respectively.

In FIGS. 18A, 18B, the laser beam L is schematically illustrated by its beam profiles. Further, arrow F, illustrated in FIG. 18A, and arrow S, illustrated in FIG. 18B, indicate the fast axis direction and the slow axis direction of the laser beam L, respectively.

In some kind of laser beam machining apparatus, when microfabrication is performed in such a manner that the fast axis is matched with the main scan direction X, as illustrated in FIG. 18A, a sag is generated on a side of the region Ap to be treated at a start of scanning in the sub scan direction Y in some cases. This sag forms a linear wrong treatment portion, indicated by G in FIG. 18A, as scanning in the sub scan direction continues. According to a research by the inventor of the present disclosure, such a problem is attributable to the presence of the aforementioned protrusion in the beam profile of the laser beam L in the fast axis direction. That is because the problem is avoided when microfabrication is performed in such a manner that the slow axis direction is matched with the main scan direction X, as illustrated in FIG. 18B.

Therefore, in the present embodiment, the direction and the beam diameter of the laser beam L is set in such a manner that the slow axis is matched with the main scan direction X and the diameter of the irradiation beam is sufficiently small in the main scan direction X (i.e., the beam diameter of the laser beam before entering the focusing lens 19 is sufficiently large) by the first beam conversion unit including the prism pair composed of prisms 13, 14 and the second beam conversion unit including the prism pair composed of prisms 16, 17, illustrated in FIGS. 1A, 1B. As a result, generation of the aforementioned problem is avoidable.

Besides the laser beam machining apparatus, wrong recording similar to the aforementioned wrong treatment may occur also in an apparatus for recording an image by scanning a recording material in a main scan direction and in a sub scan direction with the laser beam L, depending on the recording material. In such a case, wrong recording is also avoidable by adopting a similar measure to this third embodiment.

Fourth Embodiment

This fourth embodiment is also an embodiment of a light source apparatus of the present disclosure, which is not limited to use for a flow cytometer. The configuration of this light source apparatus is similar to the laser light source apparatus 1 for a flow cytometer, illustrated in FIGS. 1A, 1B, but a subject to be irradiated with a laser beam L is not the flow cell 20, illustrated in FIGS. 1A, 1B, but a recording medium, such as an optical disk, on which pits for carrying information are formed.

Figure 19:
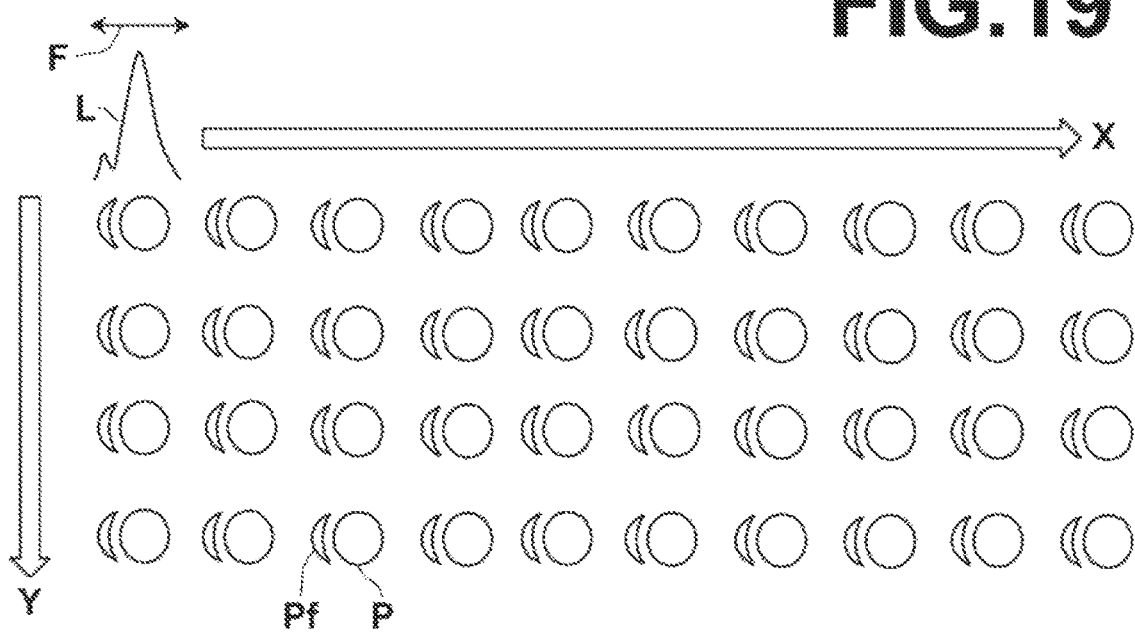
FIG. 19 is a schematic diagram for explaining the action of a light source apparatus according to the fourth embodiment of the present disclosure.

This recording apparatus for forming pits on a recording medium forms pits by two-dimensionally scanning a surface of the recording medium with the laser beam L emitted from the light source apparatus. Specifically, as schematically illustrated in FIG. 19, the surface of the recording medium is scanned with the laser beam L in the main scan direction and the sub scan direction, indicated by broad arrows X, Y, respectively. In FIG. 19, the laser beam L is schematically illustrated by its beam profile. Further, arrow F, illustrated in FIG. 19, indicates the fast axis direction of the laser beam L.

In some kind of recording medium, when a pit P is formed in such a manner that the fast axis is matched with the main scan direction X, as illustrated in FIG. 19, an unwanted partial pit Pf is formed towards the back of the pit P in the scan direction in some cases. This partial pit Pf may cause an error in readout when a correct pit P is read out from the recording medium. According to a research by the inventor of the present disclosure, formation of such a partial pit Pf is attributable to the presence of the aforementioned protrusion in the beam profile of the laser beam L in the fast axis direction. That is because the partial pit Pf is not formed when the pit P is formed in such a manner that the slow axis direction is matched with the main scan direction X.

Therefore, in the present embodiment, the direction and the beam diameter of the laser beam L are set in such a manner that the slow axis is matched with the main scan direction X and the diameter of the irradiation beam is sufficiently small in the main scan direction X (i.e., the beam diameter of the laser beam before entering the focusing lens 19 is sufficiently large) by the first beam conversion unit including the prism pair composed of prisms 13, 14 and the second beam conversion unit including the prism pair composed of prisms 16, 17, illustrated in FIGS. 1A, 1B. As a result, the aforementioned formation of the partial pit Pf is avoidable.

What is claimed is:

1. A light source apparatus used for a flow cytometer, which is configured to cause a plurality of particles to flow in a flow cell in such a manner to follow one after another in a flow cell length direction and to irradiate the plurality of particles with a laser beam from a side of a flow thereof, the light source apparatus for irradiating the particles with the laser beam, comprising:
   a semiconductor laser that is configured to emit the laser beam;
   a collimating lens that is configured to collimate the laser beam emitted from the semiconductor laser in a spread light state;
   a beam conversion unit that is configured to match the flow cell length direction with a slow axis direction of the laser beam collimated by the collimating lens in the flow cell after reducing the beam diameter of the laser beam in a fast axis direction and increasing the beam diameter in the slow axis direction; and
   a focusing lens that is configured to focus the laser beam that has passed through the beam conversion unit in the flow cell.

2. A light source apparatus used for a flow cytometer, which is configured to cause a plurality of particles to flow in a flow cell in such a manner to follow one after another in a flow cell length direction and to irradiate the plurality of particles with a laser beam from a side of a flow thereof, the light source apparatus for irradiating the particles with the laser beam, comprising:
   a plurality of semiconductor lasers that is configured to emit laser beams having different wavelengths from each other;
   a plurality of collimating lenses that is configured to collimate the laser beams emitted from the plurality of semiconductor lasers each in a spread light state;
   a beam conversion unit for each wavelength that is configured to match the flow cell length direction with a slow axis direction of the respective laser beams collimated by the collimating lenses in the flow cell after reducing the beam diameter of each of the laser beams in a fast axis direction and increasing the beam diameter in the slow axis direction;
   a beam combiner that is configured to combine the laser beams passed through the beam conversion unit for each wavelength; and
   a focusing lens that is configured to focus the laser beams combined by the beam combiner in the flow cell.

3. The light source apparatus for a flow cytometer, as defined in claim 2, wherein the focusing lens is an achromatic lens.

4. The light source apparatus for a flow cytometer, as defined in claim 2, wherein the beam conversion unit emits the collimated laser beams having different wavelengths from each other in different directions from each other by a wavelength dispersion function.

5. The light source apparatus for a flow cytometer, as defined in claim 1, wherein the beam conversion unit is able to deflect the laser beam in the slow axis direction, and/or, the fast axis direction.

6. The light source apparatus for a flow cytometer, as defined in claim 2, wherein the beam conversion unit is able to deflect the laser beam in the slow axis direction, and/or, the fast axis direction.

7. The light source apparatus for a flow cytometer, as defined in claim 5, wherein the beam conversion unit deflects the laser beam by rotating a prism pair.

8. The light source apparatus for a flow cytometer, as defined in claim 6, wherein the beam conversion unit deflects the laser beam by rotating a prism pair.

9. The light source apparatus for a flow cytometer, as defined in claim 1, wherein the beam conversion unit increases the beam diameter of the laser beam in the slow axis direction to a larger diameter than the reduced beam diameter in the fast axis direction.

10. The light source apparatus for a flow cytometer, as defined in claim 2, wherein the beam conversion unit increases the beam diameter of the laser beam in the slow axis direction to a larger diameter than the reduced beam diameter in the fast axis direction.

11. The light source apparatus for a flow cytometer, as defined in claim 1, wherein a beam waist diameter of the laser beam at a focusing position in the flow cell in the slow axis direction of the laser beam is smaller than a beam waist diameter of the laser beam in the fast axis direction.

12. The light source apparatus for a flow cytometer, as defined in claim 2, wherein a beam waist diameter of the laser beam at a focusing position in the flow cell in the slow axis direction of the laser beam is smaller than a beam waist diameter of the laser beam in the fast axis direction.

13. A light source apparatus comprising:
   a semiconductor laser that is configured to emit a laser beam;
   a collimating lens that is configured to collimate the laser beam emitted from the semiconductor laser in a spread light state;
   a beam conversion unit that is configured to match a slow axis direction of the laser beam collimated by the collimating lens with one predetermined direction at a laser beam irradiation position after reducing the beam diameter of the laser beam in a fast axis direction and increasing the beam diameter in the slow axis direction; and
   a focusing lens that is configured to focus the laser beam passed through the beam conversion unit.

* * * * *